United States Patent
Motsiff et al.

(10) Patent No.: US 6,876,058 B1
(45) Date of Patent: Apr. 5, 2005

(54) WIRING PROTECTION ELEMENT FOR LASER DELETED TUNGSTEN FUSE

(75) Inventors: William T. Motsiff, Essex Junction, VT (US); Christopher D. Muzzy, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,617

(22) Filed: Oct. 14, 2003

(51) Int. Cl.$^7$ .......................... H01L 29/00; H01L 21/82
(52) U.S. Cl. ........................ 257/529; 257/659; 438/132; 438/381
(58) Field of Search ................................ 257/529, 659, 257/758, 759, 762, 763; 438/132, 381, 622, 623, 648, 687

(56) References Cited

U.S. PATENT DOCUMENTS

| | | |
|---|---|---|
| 5,608,257 A | 3/1997 | Lee et al. |
| 5,661,331 A | 8/1997 | Hebbeker et al. |
| 5,729,041 A | 3/1998 | Yoo et al. |
| 5,986,319 A | 11/1999 | Huggins |
| 6,300,232 B1 | 10/2001 | Satoh |
| 6,339,250 B1 | 1/2002 | Ido et al. |
| 6,355,968 B1 | 3/2002 | Lehmann et al. |
| 6,362,514 B1 * | 3/2002 | Ido et al. ............ 257/529 |
| 6,372,556 B1 | 4/2002 | Ko |
| 6,423,582 B1 | 7/2002 | Fischer et al. |
| 6,444,544 B1 | 9/2002 | Hu et al. |
| 6,486,526 B1 | 11/2002 | Narayan et al. |
| 6,486,528 B1 | 11/2002 | Pedersen et al. |
| 6,518,140 B2 | 2/2003 | Jeong et al. |
| 6,649,997 B2 * | 11/2003 | Koike ............ 257/529 |

* cited by examiner

*Primary Examiner*—Mark V. Prenty
(74) *Attorney, Agent, or Firm*—Schmeiser, Olsen & Watts; William D. Sabo

(57) ABSTRACT

A structure and associated method for protecting an electrical structure during a fuse link deletion by focused radiation. The structure comprises a fuse element, a protection plate, a first dielectric layer, and a second dielectric layer. The structure is formed within a semiconductor device. The protection plate is formed within the first dielectric layer using a damascene process. The second dielectric layer is formed over the protection plate and the first dielectric layer. The fuse element is formed over the second dielectric layer. The fuse element is adapted to be cut with a laser beam. The dielectric constant of the second dielectric layer is greater than the dielectric constant of the first dielectric layer. The protection plate is adapted to shield the first dielectric layer from energy from the laser beam.

20 Claims, 1 Drawing Sheet

WIRING PROTECTION ELEMENT FOR LASER DELETED TUNGSTEN FUSE

BACKGROUND OF INVENTION

1. Technical Field

The present invention relates to a structure and associated method to protect an electrical structure during a fuse link deletion by focused radiation.

2. Related Art

Re-routing circuit paths in an electronic structure typically results in damage to the electronic structure. Damage to the electronic structure may cause the electronic structure to malfunction thereby increasing manufacturing costs. Therefore any apparatus and method to reduce damage to an electronic structure while re-routing circuit paths would be welcome by the industry.

SUMMARY OF INVENTION

The present invention provides an electrical structure, comprising:

a fuse, a protection plate, a first dielectric layer, and a second dielectric layer, wherein the electrical structure exists within a semiconductor device, wherein the protection plate exists within the first dielectric layer, wherein the second dielectric layer is formed over the protection plate and the first dielectric layer, wherein the fuse is formed over the second dielectric layer, wherein the fuse is adapted to be cut with a laser beam, wherein the dielectric constant of the second dielectric layer is greater than the dielectric constant of the first dielectric layer, and wherein the protection plate is adapted to shield the first dielectric layer from energy from the laser beam.

The present invention provides a method for forming an electrical structure, comprising:

forming a first dielectric layer within a semiconductor device;

forming, with a damascene process, a protection plate within the first dielectric layer;

forming a second dielectric layer over the protection plate and the first dielectric layer; and forming a fuse element over the second dielectric layer, wherein the fuse element is adapted to be cut with a laser beam, wherein the dielectric constant of the second dielectric layer is greater than the dielectric constant of the first dielectric layer, and wherein the protection plate is adapted to shield the first dielectric layer from energy from the laser beam.

The present invention advantageously provides a structure and associated method to reduce damage to an electronic structure while re-routing circuit paths.

DETAILED DESCRIPTION

Figure 1:
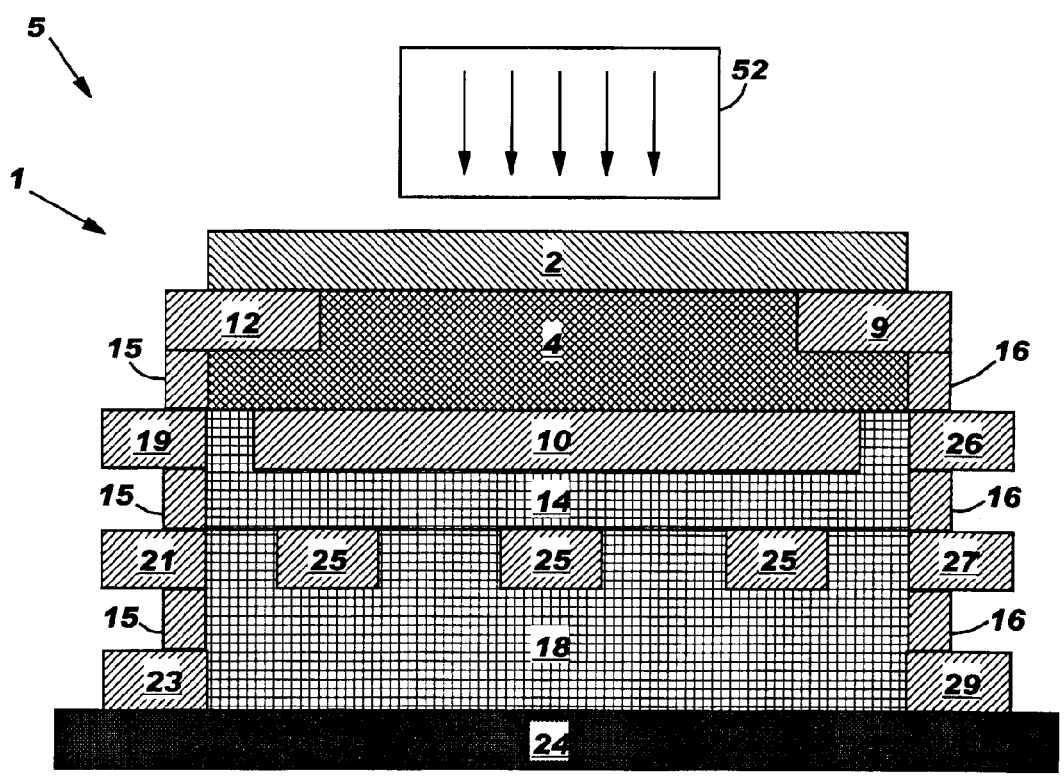
FIG. 1 illustrates a cross-sectional view of a damascene structure within a semiconductor device comprising, in accordance with embodiments of the present invention.

FIG. 1 illustrates a cross-sectional view of a damascene structure 1 within a semiconductor device 5 comprising, a semiconductor substrate 24, a plurality of dielectric layers 4, 14, and 18, a fuse element 2 herein referred to as fuse 2, a protection plate 10, and at least one electrical structure 25, in accordance with embodiments of the present invention. The fuse 2 electrically connects a conductive line 12 to a conductive line 9. The conductive line 12 is electrically connected to conductive lines 19, 21, and 23 using conductive vias 15. The conductive line 9 is electrically connected to conductive lines 25, 27, and 29 using conductive vias 16. The fuse 2 is used for re-routing circuit paths (i.e., conductive lines 19, 21, 23 25, 27, and 29) to provide, inter alia, redundant circuits, electronic chip identification, specific feature activation, etc. The fuse 2 is adapted to be cut (i.e., continuity of the fuse disrupted) with focused radiation (e.g., a laser beam 52), thereby disconnecting the conductive line 12 from the conductive line 9. The dielectric layer 4 may comprise any standard dielectric material know to a person of ordinary skill in the art including, inter alia, $SiO_2$, $Si_3N_4$, Fluorinated Silicate Glass (FSG), Tetraethoxysilane (TEOS), etc. The dielectric layer 4 may comprise a relative dielectric coefficient of about 3.5 to about 7. The dielectric layers 14 and 18 may be a low k dielectric comprising a relative dielectric coefficient of about 1 to about 4. The low k dielectric may be, inter alia, a porous dielectric with micro-pores, a polymer based dielectric, an inorganic dielectric, etc. The low k dielectric may comprise, inter alia, SiLK® by Dow Chemical, JSR Micro owned spin-on materials (i.e. LKD-5109), $Si_wC_xO_yH_z$, porous glasses (e.g., nanoglass), Porous polymers (e.g., porous SiLK®, highly fluorinated polymer (e.g., Teflon®), etc. The fuse 2 comprises a refractory metal such as, inter alia, tungsten. The protection plate 10 may comprise, inter alia, copper, aluminum, etc. The at least one electrical structure 25 is formed within the dielectric layer 18. The at least one electrical structure 25 may be, inter alia, a conductive line (i.e., a wire), an electrical component, etc. The electrical component may be any electrical component known to a person of ordinary skill in the art including, inter alia, a transistor, a resistor, a capacitor, an inductor, etc. If the at least one electrical structure 25 is a conductive line then the conductive line is formed using a damascene process. Any damascene process known to a person of ordinary skill in the art may be used including, inter alia, single damascene process, dual damascene process, etc. The conductive line may comprise, inter alia, one or more of Ta, TaN, Ti, TiN, Al, Cu, TiW, W, Cr, or Au. When the fuse 2 is cut with the laser beam 52, excess laser energy escapes either around the fuse 2 or through the cut fuse 2 and may damage the low k dielectric layers 14 and 18 and/or the at least one electrical structure 25. The protection plate 10 is formed in the dielectric layer 14 between an active part (i.e., the section to be cut) of the fuse 2 and the dielectric layer 14, the dielectric layer 18, and the at least one electrical structure 25. The placement of the protection plate 10 will protect the low k dielectric layers 14 and 18 and/or the at least one electrical structure 25 from the excess laser energy. Absorption of the excess laser energy directly by the dielectric layer 14 and the dielectric layer 18 results in dielectric damage and may compromise semiconductor device 5 performance and reliability. A balance must exist between the reflectivity, thermal capacity (cal/g° C.) and thermal conductivity (watts/cm° C.) of the fuse 5 material (e.g., tungsten) and of the protection plate 10 material (e.g., copper). In a preferred embodiment of the present invention, the fuse 5 material has a relatively low reflectivity (i.e., less than about 50%) so it absorbs laser energy well, a relatively low thermal capacity (i.e., less than about 0.08 cal/g° C.) so it heats and expands rapidly, and a relatively low thermal conductivity (i.e., less than about 2.5 watts/cm° C.) so that heat (i.e., from the excess laser energy) is not rapidly dissipated. The protection plate 10 material has high reflectivity (i.e., greater than about 80%), a high thermal capacity (i.e., greater than about 0.1 cal/g° C.), and a high thermal conductivity (i.e., greater than about 2.5 watts/cm° C.). A simple method to examine the simple balance between the reflectivity, thermal capacity, and thermal conductivity of the fuse 5 material (e.g., tungsten) and of the protection plate 10 material (e.g., copper) is to examine a ratio of the products of reflectivity, thermal capacity, and thermal conductivity (i.e., reflectivity*thermal capacity*thermal conductivity) of the fuse 5 material and the protective plate 10 material. The ratio of the products should be greater than or equal to 2. For example, if the radiation from the laser beam 52 comprises a wavelength of about 1 micron, the reflectivity of a copper protection plate 10 is about 95%, the thermal capacity is about 0.1 (cal/g ° C.) and the thermal conductivity is about 4 (watts/cm° C.) therefore the product (i.e., reflectivity*thermal capacity*thermal conductivity) is 0.38. At the same wavelength, the reflectivity of a tungsten fuse 2 is about 50%, the thermal capacity is about 0.04 (cal/g° C.), and the thermal conductivity is about 1.8 (watts/cm° C.) therefore the product (i.e., reflectivity*thermal capacity*thermal conductivity) is 0.036. The ratio of the copper protection plate 10 and the Tungsten fuse 2 is 0.38/0.036~10 and 10 is >2. Therefore, the use of a copper protection plate 10 and a tungsten fuse 2 is an embodiment of the present invention. The protection plate 10 is formed in the dielectric layer using a damascene process. Any damascene process known to a person of ordinary skill in the art may be used including, inter alia, single damascene process dual damascene process, etc.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electrical structure, comprising:
    a fuse, a protection plate, a first dielectric layer, and a second dielectric layer, wherein the electrical structure exists within a semiconductor device, wherein the protection plate exists within the first dielectric layer, wherein the second dielectric layer is formed over the protection plate and the first dielectric layer, wherein the fuse is formed over the second dielectric layer, wherein the fuse is adapted to be cut with a laser beam, wherein the dielectric constant of the second dielectric layer is greater than the dielectric constant of the first dielectric layer, and wherein the protection plate is adapted to shield the first dielectric layer from energy from the laser beam.

2. The electrical structure of claim 1, further comprising a third dielectric layer below the first dielectric layer, wherein at least one structure exists within the third dielectric layer, wherein the dielectric constant of the second dielectric layer is greater than the dielectric constant of die third dielectric layer, and wherein the protection plate is further adapted to shield third dielectric layer and the at least one structure from the energy from the laser beam.

3. The electrical structure of claim 2, wherein the at least one structure is selected from the group consisting of a conductive line and an electrical component.

4. The electrical structure of claim 1, wherein the fuse comprises a first material, wherein the protection plate comprises a second material, and wherein the first material and the second material are not a same material.

5. The electrical structure of claim 4, wherein a first product of the reflectivity, thermal capacity, and thermal conductivity of the first material is less than a second product of the reflectivity, thermal capacity, and thermal conductivity of the second material.

6. The electrical structure of claim 5, wherein a ratio of the second product to the first product is at least 2:1.

7. The electrical structure of claim 4, wherein the first material is tungsten, and wherein the second material is copper.

8. The electrical structure of claim 1, wherein the dielectric constant of the first dielectric layer is in a range of about 1 to about 4.

9. The electrical structure of claim 1, wherein the second dielectric layer comprises a material selected from the group consisting of $SiO_2$, $Si_3N_4$, Fluorinated Silicate Glass (FSG), and Tetraethoxysilane (TEOS).

10. The electrical structure of claim 1, wherein the first dielectric layer comprises a material selected from the group consisting of SiLK®, JSR Micro owned spin-on materials, $Si_wC_xO_yH_z$, porous glasses, porous polymers, and highly fluorinated polymer.

11. A method for forming an electrical structure, comprising:
    forming a first dielectric layer within a semiconductor device;
    forming, with a damascene process, a protection plate within the first dielectric layer;
    forming a second dielectric layer over the protection plate and the first dielectric layer, and
    forming a fuse element over the second dielectric layer, wherein the fuse element is adapted to be cut with a laser beam, wherein th dielectric constant of the second dielectric layer is greater than the dielectric constant of the first dielectric layer, and wherein the protection plate is adapted to shield the first dielectric layer from energy from the laser beam.

12. The method of claim 11, further comprising forming a third dielectric layer below the first dielectric layer, and
    forming, with a damascene process, at least one structure within the third dielectric layer, wherein the dielectric constant of the second dielectric layer is greater than the dielectric constant of the third dielectric layer, and wherein the protection plate is further adapted to shield the at least one structure and the third dielectric layer from the energy from the laser beam.

13. The method of claim 12, wherein the at least one structure is selected from the group consisting of a conductive line and an electrical component.

14. The method of claim 11, wherein the fuse element comprises a first material, wherein the protection plate comprises a second material, and wherein the first material and the second material are not a same material.

15. The method of claim 14, wherein a first product of the reflectivity, thermal capacity, and thermal conductivity of the first material is less than a second product of the reflectivity, thermal capacity, and thermal conductivity of the second material.

16. The method of claim 15, wherein a ratio of the second product to the first product is at least 2:1.

17. The method of claim 14, wherein the first material is tungsten, and wherein the second material is copper.

18. The method of claim 11, wherein the dielectric constant of the first dielectric layer is in a range of about 1 to about 4.

19. The method of claim 11, wherein the second dielectric layer comprises a material selected from the group consisting of $SiO_2$, $Si_3N_4$, Fluorinated Silicate Glass (FSG), and tetraethoxysilane (TEOS).

20. The method of claim 11, wherein the first dielectric layer comprises a material selected from the group consisting of SiLK®, JSR Micro owned spin-on materials, $Si_wC_xO_yH_z$, porous glasses, porous polymers, and highly fluorinated polymer.

* * * * *

UNITED STATES PATENT AND TRADEMARK OFFICE
CERTIFICATE OF CORRECTION

PATENT NO.   : 6,876,058 B1
DATED        : April 14, 2005
INVENTOR(S)  : Motsiff et al.

It is certified that error appears in the above-identified patent and that said Letters Patent is hereby corrected as shown below:

Column 3,
Line 56, delete "die" and insert -- the --

Signed and Sealed this

Seventh Day of June, 2005

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,876,058 B1 |
| DATED | : April 5, 2005 |
| INVENTOR(S) | : Motsiff et al. |

It is certified that error appears in the above-identified patent and that said Letters Patent is hereby corrected as shown below:

<u>Title page,</u>
Item [45], Date of Patent, delete "April 14, 2005" and insert -- April 5, 2005 --.

Signed and Sealed this

Sixteenth Day of August, 2005

JON W. DUDAS
*Director of the United States Patent and Trademark Office*